United States Patent [19]

Ogura et al.

[11] Patent Number: 5,286,975
[45] Date of Patent: Feb. 15, 1994

[54] PYRO-ELECTRIC TYPE INFRARED-RAY SENSOR

[75] Inventors: Toshiaki Ogura, Hirakata; Nahoko Shimamura, Kadoma; Masaki Aoki, Mino, all of Japan

[73] Assignee: Matsushita Electric Industrial Co., Ltd., Kadoma, Japan

[21] Appl. No.: 889,700

[22] Filed: May 29, 1992

[30] Foreign Application Priority Data

May 29, 1991 [JP] Japan ................................. 3-124134
Nov. 25, 1991 [JP] Japan ................................. 3-308159

[51] Int. Cl.5 ........................................ G01J 5/02
[52] U.S. Cl. ....................................... 250/338.3
[58] Field of Search ............................ 250/338.3

[56] References Cited

FOREIGN PATENT DOCUMENTS

| 132532 | 10/1981 | Japan | 250/338.3 |
| 60-171425 | 9/1985 | Japan | |
| 61-38432 | 2/1986 | Japan | |
| 61-79124 | 4/1986 | Japan | |
| 311124 | 12/1988 | Japan | 250/338.3 |

Primary Examiner—Carolyn E. Fields
Attorney, Agent, or Firm—Cushman, Darby & Cushman

[57] ABSTRACT

A pyro-electric type infrared-ray sensor comprises a pyro-electric thin film such as Pb TiO$_3$, an upper electrode of Al film formed on the upper surface of the pyro-electric thin film, a lower electrode thin film of Al formed on the bottom surface thereof and an organic thin film which covers the upper surface, and the sensor further comprises an infrared light reflection member, at least partially on the surface of the organic thin film.

4 Claims, 6 Drawing Sheets

PYRO-ELECTRIC TYPE INFRARED-RAY SENSOR

FIELD OF THE INVENTION AND RELATED ART STATEMENT

1. Field of the Invention

The present invention relates to an infrared-ray sensor, and, particularly, to a pyro-electric type infrared-ray sensor using a pyro-electric thin film.

2. Description of the Related Art

A pyro-electric type infrared-ray sensor is a thermal type infrared-ray sensor which is capable of operating at a normal temperature. It has a small wavelength-dependency of sensitivity, and shows a high sensitivity among the thermal type sensors. In principle, the pyro-electric type infrared-ray sensor detects infrared-rays by utilizing a pyro-electric phenomenon or pyro-electric effect that, when temperature of a pyro-electric material is changed, the electric charges generated on the surface of the material varies responding to the temperature change, namely.

There are the following three steps in the pyro-electric detecting process.

(1) First, temperature (T) of the pyro-electric material is raised by $\Delta T$ by absorbing an incident light (intensity L).
(2) Next, an electric charge ($\Delta Q$) is produced on the surface of the pyro-electric material based on the change $\Delta Ps$ of polarization (Ps) of the pyro-electric material owing to the temperature rise.
(3) Then, the electric charge ($\Delta Q$) is taken out to an external circuit as a current or a voltage.

Thus, the temperature rise in the pyro-electric material, which is a factor for producing the electric charge, is important in the pyro-electric type infrared-ray sensor.

A quantity of heat absorbed by the pyro-electric material is given by $\eta L$, where $\eta$ is the heat absorption rate (which is the same value as the heat emissivity) and L is the intensity of incident light.

And there is a heat loss of $G\Delta T$ from the pyro-electric material by the temperature rise $\Delta T$, where G represents a heat conductivity.

That is, an hourly variation of the temperature rise of the pyro-electric material is represented by the following equation:

$$\eta L - G\Delta T = H \cdot d(\Delta T)/dt \qquad (1)$$

From the above equation, the temperature rise $\Delta T$ is given by $$\Delta T = \eta L(\omega^2 H^2 + G^2)^{-\frac{1}{2}} \qquad (2)$$

where, H represents a heat quantity of the pyro-electric material and $\omega$ represents an angular frequency of the incident light. That is, the larger the absorption of the incident light is the larger the temperature rise of the pyro-electric material becomes. As a result the electric charge produced on the pyro-electric material surface becomes larger. Thus, in order to improve the performance as the pyro-electric type infrared-ray sensor, the infrared-ray absorption of the pyro-electric material should be increased.

Generally speaking, single crystals of TGS group, LiTaO$_3$ group and so on, ceramics of PbTiO$_3$ group, Pb$_x$Zr$_{1-x}$TiO$_3$ group and so on, and further an organic film of PVF$_2$ group and so on are usable as materials for the pyro-electric type infrared-ray sensor.

The PbTiO$_3$ has a high Fv ($=\gamma/\epsilon C_v$) and a high Fm ($=\gamma/C_v\sqrt{\epsilon d \tan \delta}$), which are figures of merit for voltage responsibility and for specific detectivity of the pyro-electric material, respectively. Here, $\gamma$ represents a pyro-electric coefficient, $\epsilon$ represents a dielectric constant, $C_v$ represents a volume specific heat and d represents thickness. PbTiO$_3$ is also characterized in a small temperature change of the pyro-electric material and a sufficiently high Curie point. Conventionally, PbTiO$_3$ ceramic is often used in the pyro-electric type infrared-ray sensor. The ceramic is polycrystalline and has no directivity in arrangements of its crystal axis, and thus the spontaneous polarization Ps is also arranged random. Since the change in spontaneous polarization Ps is read out as an output in the pyro-electric material as previously stated, a maximum output can be obtained when the spontaneous polarization Ps is aligned in one direction. Therefore, polarization processing which aligns a direction of the spontaneous polarization Ps by impressing a high electric field is necessary for the ceramics.

Recently, a report has been made that, by utilizing the pyro-electricity produced in a direction of the orientation axis of the PbTiO$_3$ thin film which is oriented along the C axis, the dielectric constant $\epsilon$ in the C-axis direction is lowered and the pyro-electric coefficient $\gamma$ is increased, hence providing a high sensitivity pyro-electric material showing a high Fv, which is about three times the Fv of PbTiO$_3$ ceramics.

Meanwhile, it is desirable that an infrared-ray array sensor should be arranged in a fine structure in order to improve a space resolution in relation with an optical system.

The thinner the pyro-electric material is, the smaller the noises become, thereby increasing a specific detectivity (D*). In case of producing an array by the PbTiO$_3$ ceramics there is a limit in improving the specific detectivity (D*) by reducing the thickness, because thinning of the ceramic film is limited. A space resolution is also deteriorated because a crosstalk between elements becomes larger owing to the distance between the respective elements. Therefore, the elements must be separated. Furthermore, since an electric capacity becomes smaller when the area is reduced, it is difficult to minimized the influence from outside of an electrostatic capacity and floating capacity. Moreover, the following problems are encountered when the pyro-electric material is subjected to the polarization processing.

(1) First, a dielectric breakdown may occur because of the polarization processing.
(2) Next, in high resolution array elements which are arranged at a high density, it is difficult to polarize them uniformly.

On the contrary, the pyro-electric thin film is designed to solve the problem in case of using the ceramics as above-mentioned. The pyro-electric thin film is prepared at a high temperature by a thin-film forming method such as sputtering. However, an infrared-ray absorption of the pyro-electric thin film is small, because its film thickness is only several $\mu$m. Also, the pyro-electric thin film such as PbTiO$_3$ is transparent to the wavelength till about 10 $\mu$m. And hence, when a sensor utilizing the pyro-electric thin film is used as a human body detecting sensor, the infrared-ray absorption in a radiant wavelength zone (10 $\mu$m wavelength zone) of the human body is small. Thus the performance as the pyro-electric type infrared-ray sensor is poor.

The pyro-electric type infrared-ray sensor which is intended to increase the infrared-ray absorption of the pyro-electric thin film has been proposed in the Japanese Unexamined Patent Applications (Tokkai) No. Sho 60-171425, No. Sho 61-38432 and No. Sho 61-79124.

A pyro-electric type heat detecting element disclosed in the Japanese Unexamined Patent Application No. Sho 60-171425 includes an electrode on a ferroelectric thin film, which is configured by a material which reflects infrared-rays. Though this serves both as the electrode and an infrared-ray reflection element, an electrode area can not be enlarged because of decrease of quantity of heat. In other words, a sufficient reflection effect can not be obtained owing to the smallness of electrode area. Thus this is also not practical, because the structure with only the ferroelectric thin film and the electrode is fragile.

A pyro-electric type infrared-ray detecting element disclosed in the Japanese Unexamined Patent Application No. Sho 61-38432 uses a cermet thin film comprising ultrafine metal particles dispersed in a dielectric as an infrared-ray absorption film. In the absorption film, there are a heat loss due to the heat radiation and also a time loss due to heat conductivity of heat to conduct from the absorption film to the pyro-electric electric thin film; thus a sensitivity and response is poor.

A pyro-electric type infrared-ray sensor disclosed in the Japanese Unexamined Patent Application No. Sho 61-79124 includes an electrode formed by a material which passes infrared-rays, and a pyro-electric thin film formed by polyvinylidene fluoride. This polyvinylidene fluoride film selectively absorbs the infrared-rays having the wavelength of 7 to 10 μm, thereby improving the sensitivity and response of the sensor. This is different from and does not suggest the present invention wherein an incident infrared-rays which has passed the pyro-electric thin film is utilized again effectively for increasing absorption of the infrared-rays by the pyro-electric thin film, by having a configuration as set forth herein.

As stated above, the conventional pyro-electric type infrared-ray sensors are not constructed such that the incident infrared-ray is used again effectively to increase the infrared-ray absorption of the pyro-electric thin film.

OBJECT AND SUMMARY OF THE INVENTION

It is an object of the present invention to provide a pyro-electric type infrared-ray array sensor which increases the infrared-ray absorption of a pyro-electric thin film and has a superior performance.

In order to achieve the above-mentioned object, the pyro-electric type infrared-ray sensor of the present invention comprises:

pyro-electric thin film;

first electrode thin film formed on a first surface of the pyro-electric thin film;

second electrode thin film formed on a second surface of the pyro-electric thin film;

an organic thin film which covers the first surface of the pyro-electric thin film; and optical element for reflecting infrared-rays provided at least partially on the surface of the organic thin film.

Furthermore, the pyro-electric type infrared-ray sensor of the present invention may comprises:

pyro-electric thin film;

first electrode thin film formed on a first surface of the pyro-electric thin film;

second electrode thin film formed on a second surface of the pyro-electric thin film;

an organic thin film which covers the first surface of the pyro-electric thin film; and optical element for reflecting infrared-rays provided at least partially in the organic thin film and disposed in substantial parallelism to the surface of the pyro-electric thin film.

Furthermore, the pyro-electric type infrared-ray sensor of the present invention may comprises:

pyro-electric thin film;

first electrode thin film formed on a first surface of the pyro-electric thin film;

second electrode thin film formed on a second surface of the pyro-electric thin film;

an organic thin film which covers the first surface of the pyro-electric thin film; and optical element for reflecting infrared rays and disposed above and with a spaced distance from the organic thin film in substantial parallelism to the first surface of the pyro-electric thin film.

The optical element of the pyro-electric type infrared-ray sensor of the present invention is constituted by metal thin film, or a multilayer film of semiconductor thin film of Si or Ge and a dielectric thin film of ZnS or $CaF_2$ or $BaF_2$.

The optical element of the pyro-electric type infrared-ray sensor of the present invention includes characteristics of reflecting infrared-rays in a 10 μm wavelength zone.

By the above-mentioned configuration, the pyro-electric type infrared-ray sensor of the present invention has the following technical advantages:

By providing an optical element having a function of reflecting infrared-rays partially on the surface of the organic thin film which covers the pyro-electric thin film, the infrared-rays having passed through the electrode, pyro-electric thin film and further the organic thin film among those incident to the pyro-electric type infrared-ray sensor enter the pyro-electric thin film again after being reflected by the surfaces of the optical element facing the pyro-electric thin film. Thus the performance of the pyro-electric type infrared-ray sensor is improved.

By providing an optical element capable of reflecting infrared-rays partially in the organic thin film which covers the pyro-electric thin film in parallel to the surface of the pyro-electric thin film, the optical element is protected by the organic thin film from possible damages. By providing a reflection surface in parallel and close to the surface of the pyro-electric thin film, incidences of the infrared-rays to the pyro-electric thin film from the reflection surfaces of the optical element is effected in good order, thereby improving the performance of the pyro-electric type infrared-ray sensor.

By providing an optical element having the function of reflecting infrared-rays in parallel to the pyro-electric thin film with a spaced distance from the organic thin film which covers the pyro-electric thin film, the infrared-rays which has passed through the electrode, pyro-electric thin film and further the organic thin film enter the pyro-electric thin film again after being reflected by an optical element having a good reflection to the infrared-rays. Thus the performance of the pyro-electric type infrared-ray sensor is improved.

Furthermore, by configuring each optical element with a metal thin film or a multilayer film of semiconductor thin film of Si or Ge and dielectric thin film of ZnS or $CaF_2$ or $BaF_2$, a high reflection is obtainable for infrared-rays to the pyro-electric thin film.

Meanwhile, since the optical element reflect rays in the 10 μm wavelength zone, the present invention is particularly effective as a human body detecting sensor.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the figures are schematic representations for purposes of illustration and do not necessarily depict the actual relative sizes or locations of the elements shown.

DESCRIPTION OF THE PREFERRED EMBODIMENTS

Numeral 1 in FIG. 1 through FIG. 6 designates a single crystal substrate of MgO. On the substrate 1, pyro-electric thin film 2 is formed. As a material of each pyro-electric thin film 2, $PbTiO_3$, PLT, or the like, is used. Electrode thin film 3 and an organic film 4, of a polyimide group resin and the like, are formed on the pyro-electric thin film. Optical element 5 has a function of reflecting infrared-rays.

The optical element 5 having a function of reflecting the infrared-rays is provided partially on the surface of the organic thin film. Alternatively, it may be provided partially in the organic thin film in parallel to the surface of the pyro-electric thin film. Further, it may be provided in parallel to the surface of the pyro-electric thin film at a spaced distance from the organic thin film. The optical element is constituted by a metal thin film of Al, Ag, Au, Cu and etc. having a high reflection factor against the infrared-rays, or a multilayer film which comprises a semiconductor thin film of Si or Ge and a dielectric thin film of ZnS or $CaF_2$ or $BaF_2$.

EMBODIMENT 1

Figure 1:
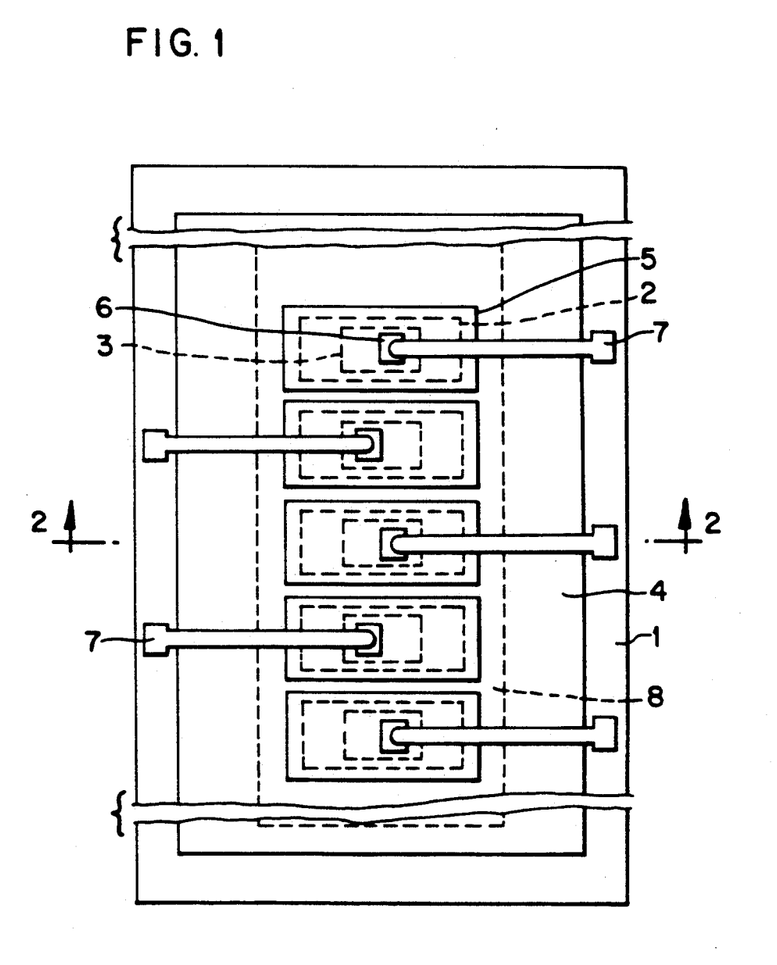
FIG. 1 is a plan view showing a structure of a pyro-electric type infrared-ray sensor of a first embodiment of the present invention.
Figure 2:
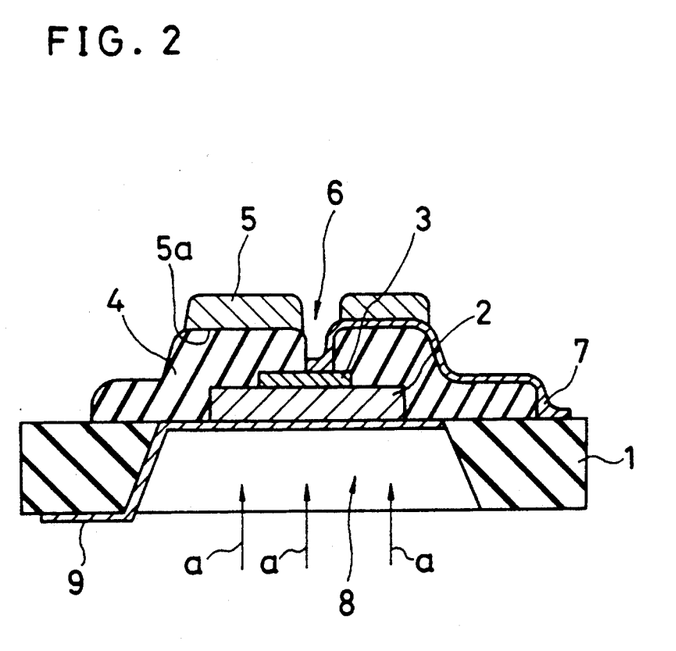
FIG. 2 is a sectional view taken along the line A-A' in FIG. 1.

In FIG. 1 and FIG. 2, on an MgO single crystal substrate 1 which has been cleaved at (100) and ground to mirror-like finishing, a $Pb_{1-x}La_xTi_{1-0.75x}O_3$ (PLT) thin film was grown to 3 μm as a pyro-electric thin film 2 by a high-frequency magnetron sputtering process. This pyro-electric thin film 2 is isolated in each element by metal masks. Mixed gas of Ar and $O_2$ is used as the atmospheric gas in the process. A sputtering condition is shown in the below-mentioned TABLE 1.

TABLE 1

| input power | 90 W |
| --- | --- |
| sputtering gas | Ar (90%) + $O_2$ (10%) |
| gas pressure | 1 Pa |
| substrate temperature | 600° C. |
| thin film deposition rate | 30 Å/min. |

Then, an Au electrode thin film 3 of about 0.2 μm thick was formed on the pyro-electric thin film 2 by vacuum evaporation. The Au electrode thin film 3 has been patterned so as to be isolated like a lattice in accordance with an array pitch by a method of photolithography. Then, an organic thin film 4 is disposed thereon. The organic thin film 4 is prepared by coating a polyimide group photopolymer by spinner followed by irradiation by ultraviolet rays and subsequent heating at 200° C. to form a film thickness of 0.3 μm. Optical element 5 capable of reflecting infrared-rays is disposed partially on the surface of the organic thin film 4. The optical element 5 is prepared by forming Al thin film of about 20 μm thickness on the organic thin film 4 and on the pyro-electric thin film 2, by vacuum evaporation. The Al thin film reflects about 95% or more infrared-rays of wavelength from 6 μm to 10 μm.

Furthermore, contact holes 6 were formed on a part of the electrode thin film 3 for contacting take-out electrodes 7 therethrough. The read-out electrodes 7 and the optical element 5 are formed so as to electrically insulated the electrodes 7 by an insulation mask and the like. It is so constructed that the optical element 5 electrically insulated with the other electrode thin film. Then, the MgO substrate 1 under the pyro-electric thin film 2 was etched to open an opening 8, through which a NiCr electrode thin film 9 was formed by vapor evaporation on the surface of the pyro-electric thin film 2 at the substrate side.

According to the above-mentioned configuration wherein the infrared-rays-reflecting optical element 5 is provided partially on the surface of the organic thin film 4 which covers the pyro-electric thin film 2, a part of the incident infrared rays "a" which is incident to the pyro-electric type infrared-ray sensor shown in FIG. 2 is absorbed by the pyro-electric thin film 2. The rest of incident infrared rays again enters pyro-electric thin film 2 after passing through the electrode 9, pyro-electric thin film 2 and further the organic thin film 4 and reflecting on a surface 5a of the optical element 5 which faces the pyro-electric thin film 2. Thereby, the whole energies of the incident infrared rays can be utilized effectively, and the infrared ray absorption in the pyro-electric thin film is much increased in comparison with the prior art, and the performance of the sensor can be improved. Accordingly, characteristics as the pyro-electric type infrared-ray sensor or sensitivity was improved by about 68% from 370 mV/°C. to 620 mV/°C. in values at the same measuring condition as compared with the prior art sensor lacking the optical element 5 for reflecting the infrared-rays.

EMBODIMENT 2

Figure 3:
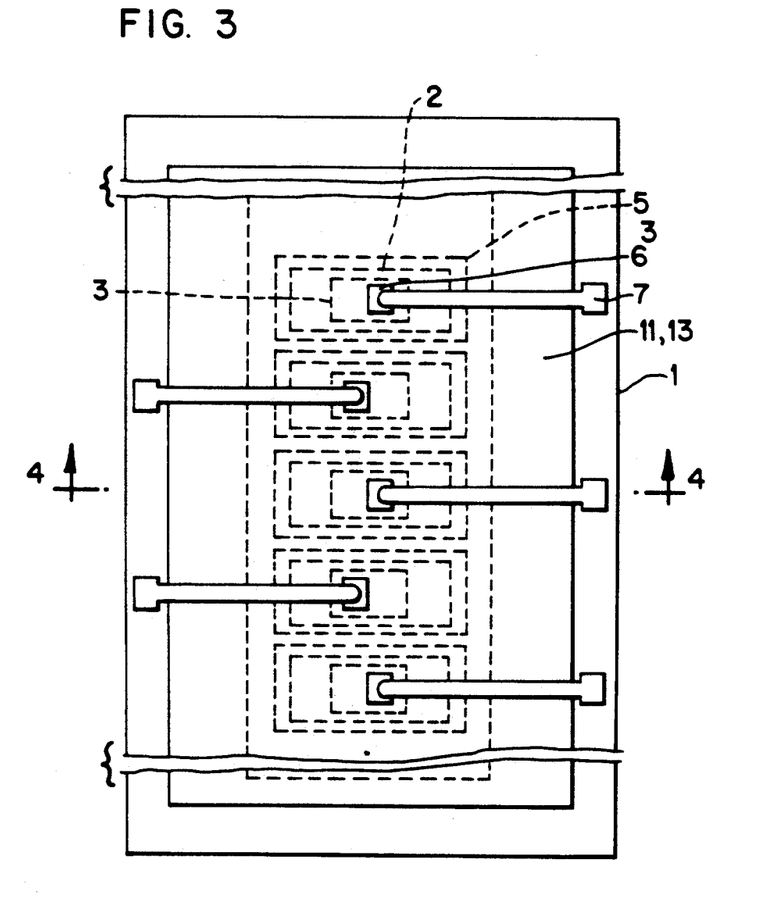
FIG. 3 is a plan view showing a structure of a pyro-electric type infrared-ray sensor of a second embodiment of the present invention.
Figure 4:
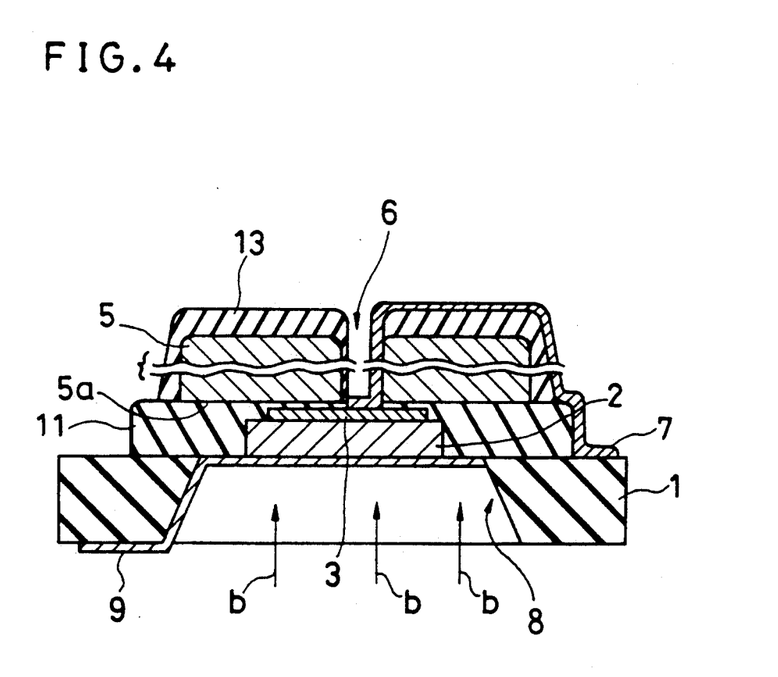
FIG. 4 is a sectional view taken along the line B-B' in FIG. 3.

FIG. 3 and FIG. 4 show a second embodiment. Process of making in this example is similar to the Embodiment 1 until the step of forming an Au electrode film 3. An organic thin film 11 is disposed on the Au electrode thin film 3. The organic thin film 11 is prepared by coating a polyimide group photopolymer by spinner, and then heating at about 200° C. after being irradiated by ultraviolet rays to form a film with thickness of 1.5 μm. Then, optical element 5 capable of reflecting infrared-rays is provided partially on the surface of the organic thin film 11. Al thin film, which reflects about 95% or more of infrared-rays of the wavelength from 6 μm to 10 μm, were formed as the optical element 5 by vacuum evaporation. Thereafter, an organic thin film 13 was formed to the film thickness of 1.5 μm in a same manner as the previous step. A contact hole 6 was provided on a part of the electrode thin film 3 so as to contact a take-out electrode 7 therewith.

The take-out electrode 7 and the optical element 5 are formed so as to be electrically insulated by the organic thin film 11.

Moreover, a MgO substrate 1 under the pyro-electric thin film 2 was etch to form an opening 8, wherethrough a NiCr electrode thin film 9 was formed by vacuum evaporation on the bottom surface of the pyro-electric thin film 2 which is at the substrate side, similarly to the Embodiment 1.

The above-mentioned configuration provides the optical element 5 for reflecting the infrared-rays so as to be partially buried in the organic thin films 11 and 13 and be in parallel relation to the surface of the pyro-electric thin film 2. Therefore, a part of infrared-rays, shown by the arrows "b" in FIG. 4 having entered the pyro-electric type infrared-ray sensor is absorbed by the pyro-electric thin film 2, and the rest of incident infrared-rays again enters the pyro-electric thin film 2, after passing through the electrode 9, pyro-electric thin film 2 and further the organic thin film 11, and reflecting on a lower surface 5a of the optical element 5 which faces the pyro-electric thin film 2. Thereby, the whole energies of the incident infrared-rays can be utilized effectively, and the infrared-ray absorption in the pyro-electric thin film 2 is increased. Thus the performance of the sensor can be improved, similarly to the case of Embodiment 1. Besides, in the case of Embodiment 2, the optical element 5 of very thin metal thin film is protected from possible mechanical or chemical damages, by being covered with the organic thin films 11 and 13. Besides, the optical element 5 and the other electrode thin film are electrically insulated by the organic films 11 and 13 with considerable reliability. Since the reflection surface 5a of the optical element 5 is provided in parallel and close to the surface of the pyro-electric thin film 2, an incidence factor of the infrared-rays to be reflected by the reflection surface of the optical element 5 and again incident to the pyro-electric thin film 2 is further improved.

EMBODIMENT 3

Figure 5:
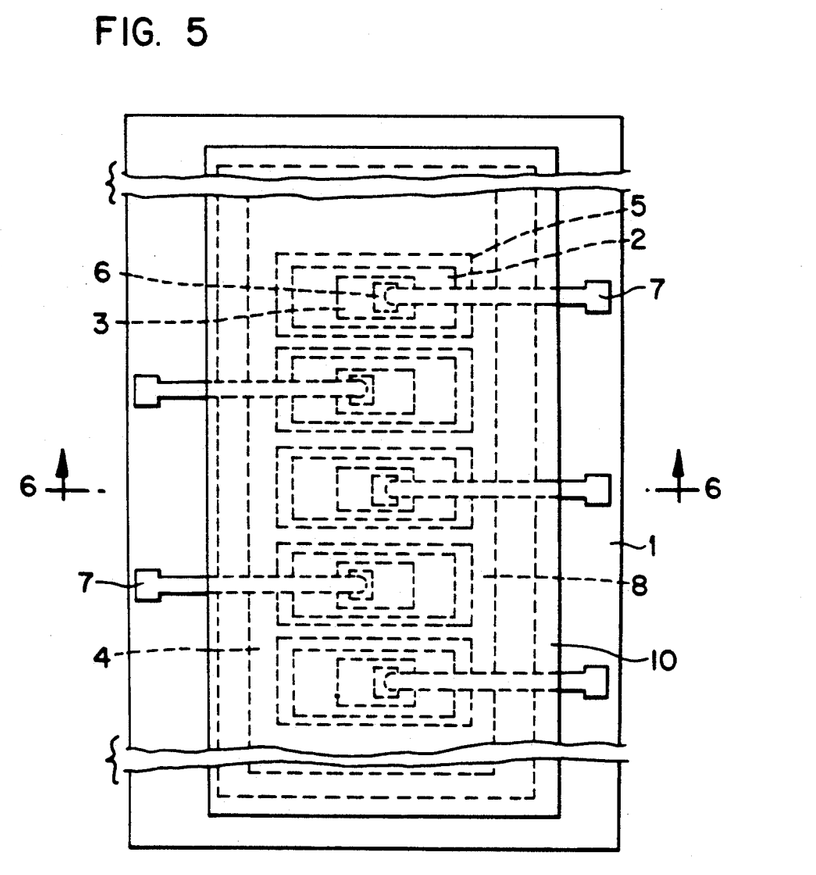
FIG. 5 is a plan view showing a structure of a pyro-electric type infrared-ray sensor of a third embodiment of the present invention.
Figure 6:
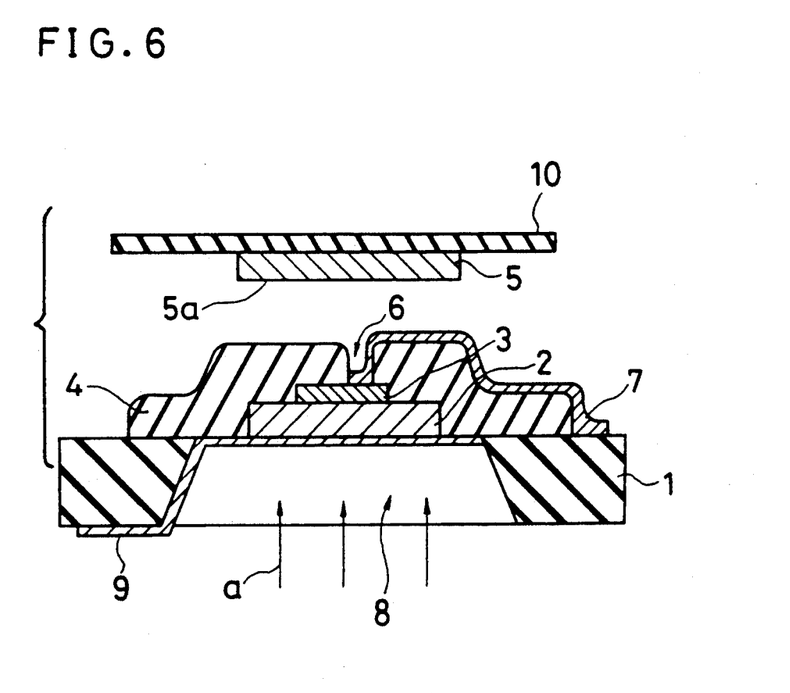
FIG. 6 is a sectional view taken along the line X-X' in FIG. 5.

FIG. 5 and FIG. 6 show a third embodiment. The process in this embodiment is similar to the Embodiment 1 until the step of forming an Au electrode thin film 3. An organic thin film 4 is disposed on the Au electrode thin film 3. The organic thin film 4 is prepared by coating a polyamide group photopolymer by spinner, and then, heating at about 200° Cm after being irradiated by ultraviolet rays to form a film with thickness of 3.0 μm. Then, optical element 5 capable of reflecting infrared-rays is provided at a distance spaced by 500 μm above from the organic thin film 4 in parallel to the surface of the pyro-electric thin film 2. The optical element 5 is prepared by forming a 30-layer alternate multilayer film of Ge and ZnS on an optical glass 10 by vacuum evaporation. The optical glass 10 is held by an enclosure (not shown). The multilayer film has a high reflection factor of reflecting about 98% or more infrared-rays in the 10 μm wavelength zone. Meanwhile, a contact hole 6 was provided on a part of the electrode thin film 3 in a manner to contact a take-out electrode 7 therethrough. Moreover, a MgO substrate 1 under the pyro-electric thin film 2 was etched so as to open an opening 8, therethrough a NiCr electrode thin film 9 was formed by vacuum evaporation on the surface of the pyro-electric thin film 2 at the substrate side. This is similar to the Embodiment 1.

The above-mentioned configuration provides the optical element 5 which reflects infrared-rays at a distance considerably spaced above from the organic thin film 4 covering the pyro-electric thin film 2 in parallel thereto. Therefore, a part of infrared-rays shown by the arrow "a" in FIG. 6 enters the pyro-electric type infrared-ray array sensor and is absorbed by the pyro-electric thin film 2. The rest of incident infrared-rays enters again to the pyro-electric thin film 2 after passing through the electrode 9, pyro-electric thin film 2 and further the organic thin film 4, pyro-electric thin film 2 and further the organic thin film 4, and being reflected by a surface 5a of each optical element 5 facing the pyro-electric thin film 2. Thereby, substantially all of the incident infrared rays can be utilized effectively, and the infrared ray absorption in the pyro-electric thin film 2 is satisfactorily increased, and thus the performance of the sensor can be improved. Accordingly, characteristics, as the pyro-electric type infrared-ray array sensor, or sensitivity was improved by about 73% corresponding to the values from 370 mV/°C. to 640 mV/°C. in values at the same measuring condition, as compared with the sensor without the optical element for reflecting infrared rays.

As stated above, in the pyro-electric type infrared-ray array sensor of the present invention, substantially the all parts of the incident infrared-rays can be utilized effectively, and therefore the sensitivity is improved.

Apart from the above-mentioned use of Al in the optical element for reflecting infrared-rays in the Embodiment 1 and Embodiment 2, other materials than Al, such as Ag, Au and Cu having a high infrared-ray reflection factor, may also be used.

Also, apart from the multilayer film of Ge and ZnS used in an optical element for reflecting infrared-rays in the Embodiment 3, other multilayer film than Ge and ZnS, for instance a combined multilayer film of Ge, Si and ZnS, $CaF_2$ may also be used.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What is claimed is:

1. A pyro-electric type infrared-ray sensor comprising:
   a pyro-electric thin film;
   a first electrode thin film formed on a first surface of said pyro-electric thin film;
   a second electrode thin film formed on a second surface of said pyro-electric thin film;
   an organic thin film which covers the first surface of said pyro-electric thin film; and an optical element for reflecting infrared-rays provided at least partially on the surface of the organic thin film.

2. A pyro-electric type infrared-ray sensor comprising:
 a pyro-electric thin film;
 a first electrode thin film formed on a first surface of said pyro-electric thin film;
 a second electrode thin film formed on a second surface of said pyro-electric thin film;
 an organic thin film which covers the first surface of said pyro-electric thin film; and
 an optical element for reflecting infrared-rays provided at least partially in the organic thin film and disposed in substantial parallelism to the surface of the pyro-electric thin film.

3. A pyro-electric type infrared-ray sensor in accordance with claim 1 or 2, wherein said optical element is a metal thin film.

4. A pyro-electric type infrared-ray sensor in accordance with claim 1 or 2, wherein the optical element reflects rays in a 10 $\mu$m wavelength zone.

* * * * *